US006368915B1

(12) United States Patent
Montree et al.

(10) Patent No.: US 6,368,915 B1
(45) Date of Patent: Apr. 9, 2002

(54) METHOD OF MANUFACTURING A SEMICONDUCTOR DEVICE

(75) Inventors: Andreas H. Montree; Jurriaan Schmitz; Pierre H. Woerlee, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/527,203

(22) Filed: Mar. 16, 2000

(30) Foreign Application Priority Data

Mar. 17, 1999 (EP) ............................................ 99200815

(51) Int. Cl.[7] ............................................. H01L 21/336
(52) U.S. Cl. ...................... 438/257; 438/259; 438/264; 438/289; 438/593; 438/594
(58) Field of Search ................................. 438/593, 259, 438/257, 594, 264, 289

(56) References Cited

U.S. PATENT DOCUMENTS

| 5,395,778 | A | | 3/1995 | Walker ........................ 438/253 |
|---|---|---|---|---|
| 5,474,947 | A | * | 12/1995 | Chang et al. ................ 438/257 |
| 5,856,225 | A | | 1/1999 | Lee et al. .................... 438/291 |
| 5,955,759 | A | * | 9/1999 | Ismail et al. ................. 257/332 |
| 6,143,635 | A | * | 11/2000 | Biyd et al. ................... 438/593 |
| 6,159,797 | A | * | 12/2000 | Lee ............................. 438/257 |
| 6,210,999 | B1 | * | 4/2001 | Gardner et al. ............. 438/257 |
| 6,214,666 | B1 | * | 4/2001 | Mehta ......................... 438/257 |
| 6,251,729 | B1 | * | 6/2001 | Montree et al. ............. 438/257 |

FOREIGN PATENT DOCUMENTS

| JP | 59031064 | 2/1984 |
|---|---|---|
| JP | 04155838 | 5/1992 |

OTHER PUBLICATIONS

"Sub–100nm Gate Length Metal Gate NMOS Transistors Fabricated by a Replacement Gate Process", by A. Chatterjee et al., IEDM 1997, pp. 821–824.

* cited by examiner

Primary Examiner—Trung Dang (57) ABSTRACT

In a method of manufacturing a semiconductor device comprising a non-volatile memory element, an active region 4 of a first conductivity type is defined at a surface 2 of a semiconductor body 1, and a patterned layer is applied, which patterned layer acts as a mask during the formation of a source zone 11 and a drain zone 12 of a second conductivity type in the semiconductor body 1. Then, a dielectric layer 14 is provided in a thickness which is sufficiently large to cover the patterned layer, which dielectric layer 14 is removed over part of its thickness by means of a material removing treatment until the patterned layer is exposed, which patterned layer is removed, thereby forming a recess in the dielectric layer 14. In this recess a first insulating layer is applied providing a floating gate dielectric 19, to which first insulating layer a first conductive layer is applied filling the recess in the dielectric layer 14, which first conductive layer is shaped into a floating gate 21 by means of masked etching. The floating gate 21 has a substantially flat surface portion 22 extending substantially parallel to the surface 2 of the semiconductor body 1 and sidewall portions 23 extending substantially perpendicularly to the surface 2 of the semiconductor body 1. In a next step, the floating gate 21 is covered with a second insulating layer providing an intergate dielectric 25, to which second insulating layer a second conductive layer is applied, which is shaped into an overlapping control gate 27. The control gate 27 is capacitively coupled to the substantially flat surface portion 22 of the floating gate 21 and to at least the sidewall portions 23 of the floating gate 21 situated adjacent to the source zone 11 and the drain zone 12 of the memory element.

12 Claims, 7 Drawing Sheets

METHOD OF MANUFACTURING A SEMICONDUCTOR DEVICE

BACKGROUND OF THE INVENTION

The invention relates to a method of manufacturing a semiconductor device comprising a semiconductor body which is provided at a surface with a non-volatile memory element having a floating gate situated between an overlapping control gate and a channel region which is situated in the semiconductor body and extends between a source zone and a drain zone, by which method an active region of a first conductivity type adjoining the surface is defined in the semiconductor body, and a floating gate dielectric is provided, to which floating gate dielectric the floating gate is applied, the floating gate having a substantially flat surface portion extending substantially parallel to the surface of the semiconductor body and having sidewall portions extending substantially perpendicularly to the surface of the semiconductor body, which floating gate is provided with an inter-gate dielectric, to which inter-gate dielectric the control gate is applied, which control gate is capacitively coupled to the substantially flat surface portion of the floating gate and to at least the sidewall portions of the floating gate situated adjacent to the source zone and the drain zone.

A method of manufacturing a semiconductor device of the kind described in the opening paragraph is known from U.S. Pat. No. 5,395,778. In the known method, the active region of the semiconductor body is provided with a first insulating layer providing the floating gate dielectric, to which first insulating layer a silicon layer is applied from which the floating gate is formed. After formation of the floating gate, the source zone and the drain zone are provided in the semiconductor body and a second insulating layer is applied providing the inter-gate dielectric. In a next step, a conductive layer is applied from which the overlapping control gate is formed, which overlapping control gate is capacitively coupled not only to the substantially flat surface portion of the floating gate but also to at least the sidewall portions of the floating gate situated adjacent to the source zone and the drain zone.

A disadvantage of the known method is that, at least adjacent to the source zone and the drain zone, the overlapping control gate is insulated from the semiconductor body only by a stack of the first insulating layer providing the floating gate dielectric covered with the second insulating layer providing the inter-gate dielectric. Consequently, parasitic capacitances are induced during operation of the memory element between the overlapping control gate on the one hand and the source zone and the drain zone in the semiconductor body on the other hand, which parasitic capacitances disadvantageously increase the supply voltage of the memory element.

SUMMARY OF THE INVENTION

It is an object of the invention to provide a method of manufacturing a semiconductor device of the kind mentioned in the opening paragraph, which method suppresses the induction of parasitic capacitances between the overlapping control gate and the semiconductor body and, hence, counteracts an increase in the supply voltage of the memory element.

According to the invention, this object is achieved in that after the definition of the active region, a patterned layer is applied, which patterned layer acts as a mask during the formation of the source zone and the drain zone of a second conductivity type in the semiconductor body, after which a dielectric layer is provided in a thickness which is sufficiently large to cover the patterned layer, which dielectric layer is removed over part of its thickness by means of a material removing treatment until the patterned layer is exposed, which patterned layer is removed, thereby forming a recess in the dielectric layer, in which recess a first insulating layer is applied providing the floating gate dielectric of the memory element, to which first insulating layer a first conductive layer is applied filling the recess in the dielectric layer, which first conductive layer is shaped into the floating gate by means of mask etching, which floating gate is covered with a second insulating layer providing the inter-gate dielectric of the memory element, to which second insulating layer a second conductive layer is applied, which second conductive layer is shaped into the overlapping control gate.

The above-stated measures in accordance with the invention enable the manufacture of a non-volatile memory element having a control gate which is capacitively coupled to at least the sidewall portions of the floating gate situated adjacent to the source zone and the drain zone, the overlapping control gate being insulated from the semiconductor body by a stack the thickness of which is increased by a dielectric layer having a thickness which is relatively large compared with the thicknesses of the first insulating layer providing the floating gate dielectric and the second insulating layer providing the inter-gate dielectric of the memory element. In this way, induction of parasitic capacitances between the overlapping control gate and the semiconductor body is suppressed and, hence, an increase in supply voltage is counteracted.

After the definition of the active region, a patterned layer is applied, which is used as a mask during the subsequent formation of a source zone and a drain zone. Prior to removal of the patterned layer, a relatively thick dielectric layer is applied in a thickness which is sufficiently large to cover the patterned layer. The dielectric layer is subsequently removed over part of its thickness by means of, for instance, chemical-mechanical polishing (CMP) until the patterned layer is exposed, which patterned layer is removed by means of selective etching, thereby forming a recess in the dielectric layer. After the removal of the patterned layer, a dip-etch may be carried out in order to remove a surface layer composed of, for instance, silicon oxide, which may have been advantageously applied to the surface of the semiconductor body in order to protect the semiconductor body against contamination. A first insulating layer is applied providing the floating gate of the memory element, to which first insulating layer a first conductive layer is applied filling the recess in the dielectric layer. The first conductive layer is subsequently shaped into the floating gate of the memory element by means of mask etching, the floating gate having a substantially flat surface portion extending substantially parallel to the surface of the semiconductor body and sidewall portions extending substantially perpendicularly to the surface of the semiconductor body. Then, a second insulating layer is applied providing the inter-gate dielectric of the memory element, to which second insulating layer a second conductive layer is applied, which is shaped into the overlapping control gate of the memory element by means of mask etching. The overlapping control gate is capacitively coupled not only to the substantially flat surface portion of the floating gate but also to at least the sidewall portions of the floating gate situated adjacent to the source zone and the drain zone. An additional removal of the second insulating layer and the first insulating layer using the same mask as applied during etching of the control gate is not required, but may be beneficial in case a material with a high dielectric constant is applied for the second insulating layer and/or the first insulating layer.

In order to achieve a large capacitive coupling between the floating gate and the overlapping control gate, it is advantageous to use an oversized mask during etching of the first conductive layer into the floating gate. In that way, the conductive material of the floating gate will stretch out over the dielectric layer, which is coated with the first insulating layer, to substantially beyond the recess in the dielectric layer at least in the directions of the source zone and the drain zone.

For MOS devices with channel lengths decreasing below about 2 μm, short-channel effects start to play an important role in respect of device behavior. Conventionally, impurities for suppressing short-channel effects are introduced after the definition of active regions adjoining the surface of the semiconductor body and after the application of a gate oxide layer covering the entire surface of the semiconductor body. In this way, the introduced impurities are distributed laterally over the entire active regions instead of over the channel regions only, and counter-doping is required for the subsequent formation of source and drain zones in regions adjoining the surface of the semiconductor body.

In order to counteract the necessity of counter-doping for the formation of a source zone and a drain zone, it is advantageous to locally introduce the above-mentioned impurities via the recess into the channel region of the semiconductor body in a self-registered way by using the dielectric layer as a mask.

The impurities may be introduced into the channel region of the semiconductor body by means of a diffusion process, involving two steps in general. First, the impurities are placed on or near the surface of the semiconductor body by a gaseous deposition step or by coating the surface with a layer containing the desired impurities. This is followed by an annealing treatment in order to further drive-in the impurities into the semiconductor body by means of diffusion. An alternative to the diffusion process, is ion implantation. The desired impurities are first ionized and then accelerated by an electric or magnetic field to a high energy, typically in the range from 1 to 500 keV. A beam of the accelerated high-energy ions strikes the surface of the semiconductor body and penetrates exposed regions thereof. The penetration is typically less than a micrometer below the surface, and considerable damage is done to the crystal lattice during implantation. Consequently, an annealing treatment is required in order to restore the damage to the crystal lattice and to activate the as-implanted impurities.

Due to its ability to more precisely control the number of introduced impurities into the semiconductor body, ion implantation is preferred to diffusion. Moreover, ion implantation allows impurity introduction into the semiconductor body with much less lateral distribution than obtainable via diffusion and, hence, allows devices to be manufactured with features of smaller dimensions.

As mentioned before, short-channel effects start to play an important role for MOS devices with channel lengths decreasing below about 2 μm. In particular, the short-channel effects known as punchthrough and short-channel threshold-voltage shift become dominant.

Punchthrough is a phenomenon associated with the merging of the depletion regions of the source zone and the drain zone. That is, as the channel gets shorter, the edges of the depletion regions get closer, assuming that the channel-region doping is kept constant as the channel length decreases. When the channel length becomes equal to roughly the sum of the widths of the depletion regions of the source zone and the drain zone, punchthrough is established.

Experimentally, it is observed that, as the channel length decreases to less than about 2 μm, the threshold voltage shifts to a value below the long-channel values, which effect is referred to as the short-channel threshold-voltage shift. The fraction of the depletion charge within the channel region under the gate, which is induced by the source zone and the drain zone, is insignificant for long-channel devices, but becomes significant for short-channel devices with the channel length approaching the sum of the widths of the depletion regions of the source zone and the drain zone. Consequently, less charge is needed to cause inversion, and the threshold voltage is reduced.

On the above grounds, it is advantageous to provide the channel region of a short-channel memory element with an impurity region for threshold voltage correction and/or punchthrough suppression. In order to reach these effects, the doping of the semiconductor body within the channel region under the floating gate needs to be increased in general. Impurities for threshold voltage correction and/or punchthrough suppression can be implanted into the channel region substantially perpendicularly to the surface of the semiconductor body. However, in order to counteract channeling of the impurities along crystal directions and planes, it is advantageous to implant the impurities into the channel region at a small angle of a few, for instance seven, degrees with the normal to the surface of the semiconductor body by tilting the semiconductor body before implantation. It is to be noted that an implantation for punchthrough suppression in general leads to an increase of the threshold voltage as well.

A further improvement of a non-volatile memory element can be achieved by a so-called halo implant, also known as pocket implant, which in general is applied in order to reach a more efficient hot-carrier generation and, hence, to increase the program speed of the memory element. For this purpose, impurities are advantageously implanted into the channel region of the memory element at an acute angle with the normal to the surface of the semiconductor body. The maximum angle at which the impurities can be implanted into the channel region is dependent on the aspect ratio of the recess in the dielectric layer.

The patterned layer, which is used as a mask during the formation of the source zone and the drain zone of the memory element, may be applied comprising, for instance, silicon nitride or aluminum oxide. However, in order to match the process flow to conventional CMOS processing, the patterned layer is advantageously applied comprising silicon. In this respect, polycrystalline silicon, or possibly amorphous silicon or $Ge_xSi_{(1-x)}$ may be applied, with the fraction of germanium x lying in the range between 0 and 1.

Experimentally, it is observed that the moment of stopping the chemical-mechanical polishing (CMP) of the dielectric layer is rather critical if the patterned layer is composed of silicon. In case the CMP process is stopped too early, oxide residue is left on the patterned layer which hinders the subsequent removal of the patterned layer. In case the CMP process is carried on too long, the definition of the height of the floating gate, which is planned to be provided at a later stage of the process, is adversely affected. In order to improve the height definition of the process, it is preferred to apply the patterned layer as a double-layer consisting of a first sub-layer comprising the silicon and, on top thereof, a second sub-layer composed of a material having a larger resistance to the material removing treatment than silicon and being selectively etchable with respect to the dielectric layer. Hence, the second sub-layer will act as etch stop layer during the removal of the dielectric layer. In this respect it is advantageous to apply silicon nitride as the second sub-layer and silicon oxide as the dielectric layer. Alternatively, aluminum oxide can be used instead of silicon nitride and/or BPSG (borophosphosilicate glass) instead of silicon oxide.

The control gate and/or the floating gate of the non-volatile memory element and, hence, the second conductive layer and/or the first conductive layer can be advantageously applied comprising a metal instead of conventional polycrystalline silicon. In contrast with polycrystalline silicon, metals intrinsically have a relatively low resistance and do not suffer from detrimental depletion effects. In this respect a low-resistance metal such as aluminum, tungsten, copper or molybdenum can be advantageously applied. In case a metal is used, the second conductive layer and/or the first conductive layer may be advantageously applied as a double-layer consisting of a layer comprising the metal on top of a layer acting as adhesion layer and/or barrier layer. In this respect titanium (Ti) may be used as adhesion layer and titanium nitride (TiN) or titanium tungsten (TiW) as barrier layer.

In order to improve the performance of the non-volatile memory element, it may be advantageous to apply a dielectric material with a dielectric constant higher than that of silicon oxide ($\epsilon$~4) as the inter-gate dielectric and/or the floating gate dielectric of the memory element and, hence, as the second insulating layer and/or the first insulating layer. In this respect, tantalum oxide ($Ta_2O_5$; $\epsilon$~20–25), aluminum oxide ($Al_2O_3$; $\epsilon$~10) or silicon nitride ($Si_3N_4$; $\epsilon$~7) can be applied to advantage, as these materials are deposited in a conformal and reproducible way by means of chemical vapor deposition (CVD).

BRIEF DESCRIPTION OF THE DRAWING

These and other aspects of the invention will be apparent from and elucidated with reference to the embodiments described hereinafter and shown in the drawing. In the drawing.

DESCRIPTION OF THE PREFERRED EMBODIMENTS

The invention is illustrated hereinafter on the basis of a single MOS non-volatile memory element. It will be evident to those skilled in the art that the invention may be advantageously used in respect of any non-volatile memory element known per se, such as an EPROM (Erasable Programmable Read-Only Memory), EEPROM (Electrically Erasable Programmable Read-Only Memory) or flash EEPROM, and that the invention may be advantageously applied in the manufacture of CMOS and BICMOS integrated circuits known per se.

FIGS. 1 to 12 show in diagrammatic cross-sectional views successive stages in the manufacture of a semiconductor device comprising a non-volatile memory element, using a first embodiment of the method in accordance with the invention.

Figure 1:
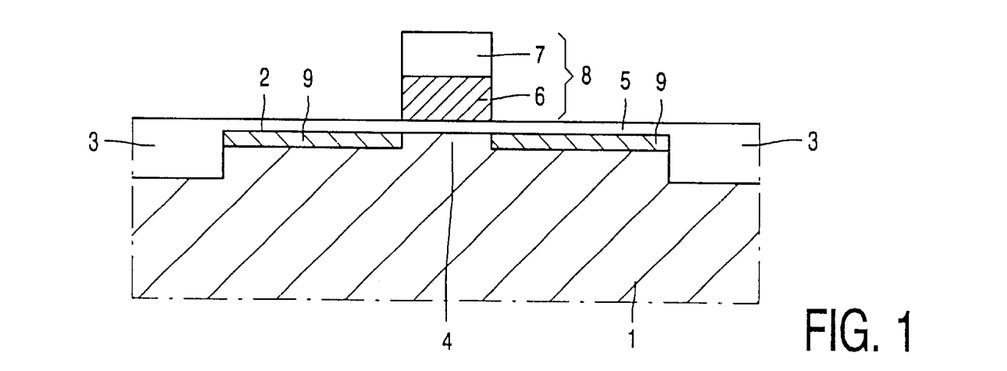
FIGS. 1 to 12 show in diagrammatic cross-sectional views successive stages in the manufacture of a semiconductor device comprising a non-volatile memory element, using a first embodiment of the method in accordance with the invention.

With reference to FIG. 1, a semiconductor body 1 of a first conductivity type, in the present example a silicon body of, for instance, p-type conductivity, is provided at a surface 2 with relatively thick oxide field insulating regions 3, which are at least partly recessed in the semiconductor body 1 and which define an active region 4 in which a non-volatile memory element, in the present example of the NMOS-type, is to be manufactured. The thick oxide insulating regions 3 are formed in a usual way by means of LOCOS (LOCal Oxidation of Silicon) or STI (Shallow Trench Isolation). Subsequently, the surface 2 of the semiconductor body 1 is provided with a layer 5 composed of, for instance, silicon oxide, which is covered with a patterned layer 8. In the present example, the patterned layer 8 is obtained by depositing a double-layer consisting of a first sub-layer 6 of, for instance, polycrystalline silicon which may be doped with a dopant such as phosphorus or possibly boron, and on top thereof, a second sub-layer 7 composed of, for instance, silicon nitride, and by patterning the double-layer, for instance, in a usual photolithographic way. Instead of silicon nitride any other suitable material such as, for instance, aluminum oxide or a combination of materials may be used. Instead of polycrystalline silicon, amorphous silicon or $Ge_xSi_{1-x}$ may be used, with x representing the fraction of germanium lying in the range between 0 and 1. It is to be noted, that the patterned layer may be a single layer as well, composed of polycrystalline silicon, amorphous silicon or $Ge_xSi_{1-x}$, or any other suitable refractory material such as, for example, silicon nitride or aluminum oxide. Furthermore, the presence of the layer 5, which may have been advantageously applied in order to protect the semiconductor body against contamination, is not necessary. After applying the patterned layer 8, source/drain extensions 9 of a second, opposite conductivity type, in the present example n-type, are formed on opposite sides of the patterned layer 8 by means of a self-aligned implantation of a relatively light dose of, for instance, phosphorus or arsenic using the patterned layer 8 together with the oxide field insulating regions 3 as a mask.

Figure 2:
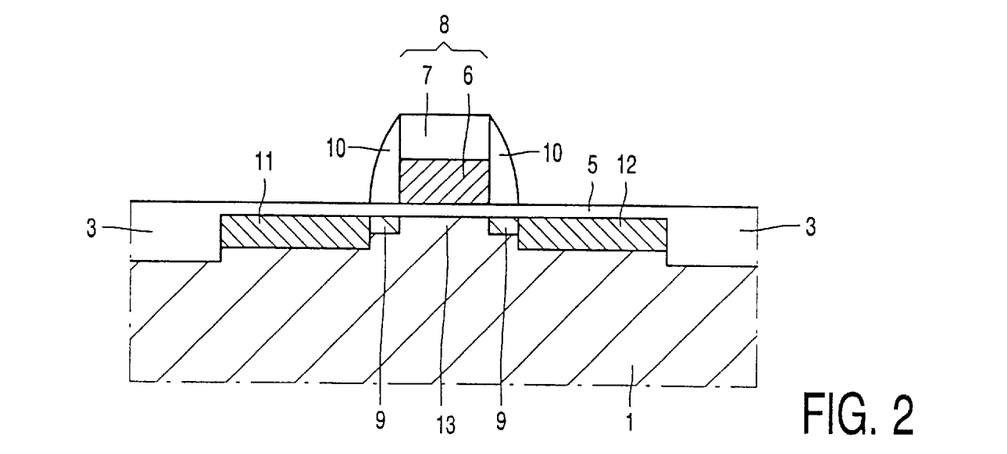

Subsequently, the patterned layer 8 is provided with sidewall spacers 10 e.g. in a known way, for instance, by means of deposition and anisotropic etching-back of a silicon oxide layer (FIG. 2). After formation of the sidewall spacers 10, a highly-doped source zone 11 and a highly-doped drain zone 12 of the second conductivity type, in the present example n-type, are formed on opposite sides of the sidewall spacers 10 by means of a self-aligned implantation of a heavier dose of, for instance, phosphorus or arsenic using the oxide field insulating regions 3 together with the patterned layer 8 and the sidewall spacers 10 as a mask. It is to be noted, that a channel region 13 is enclosed by the extended source zone 11,9 and the extended drain zone 12,9.

Figure 3:
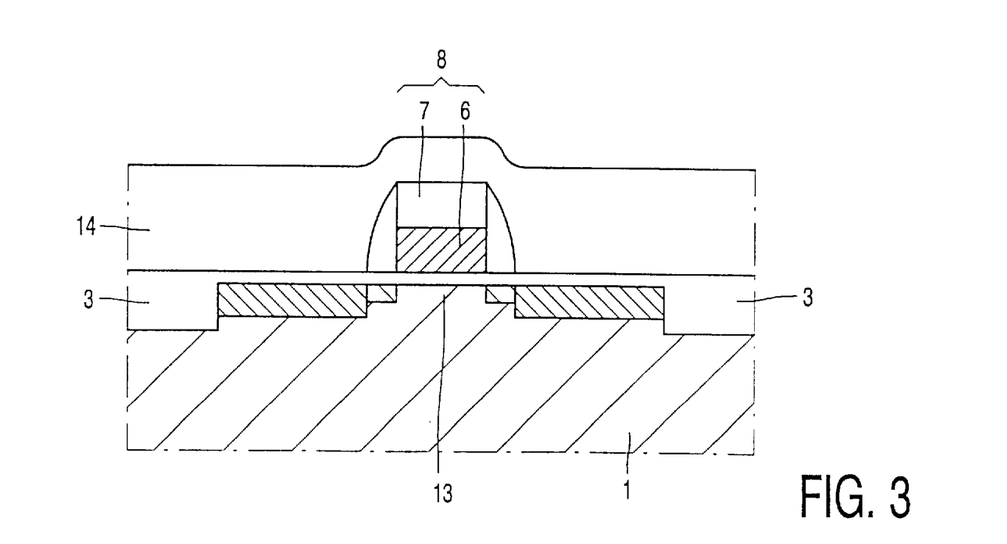

With reference to FIG. 3, a dielectric layer 14, in the present example composed of silicon oxide, is applied in a thickness, which is sufficiently large to cover the patterned layer 8. Obviously, other suitable electrically insulating materials such as PSG (phosphosilicate glass) or BPSG (borophosphosilicate glass) may be used as well. The thickness of the dielectric layer 14 may be, for instance, in the range of about 150 to 200 nm.

Figure 4:
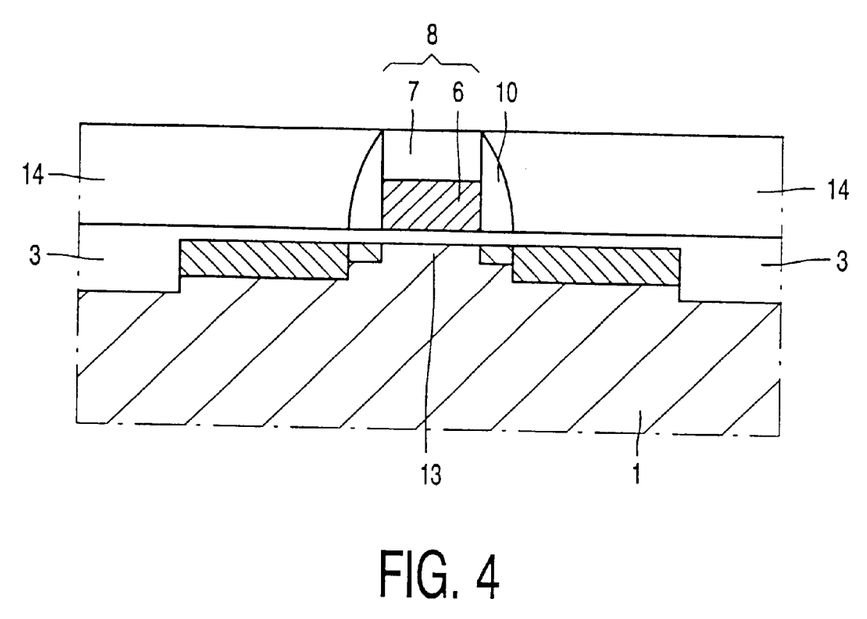
Figure 5:
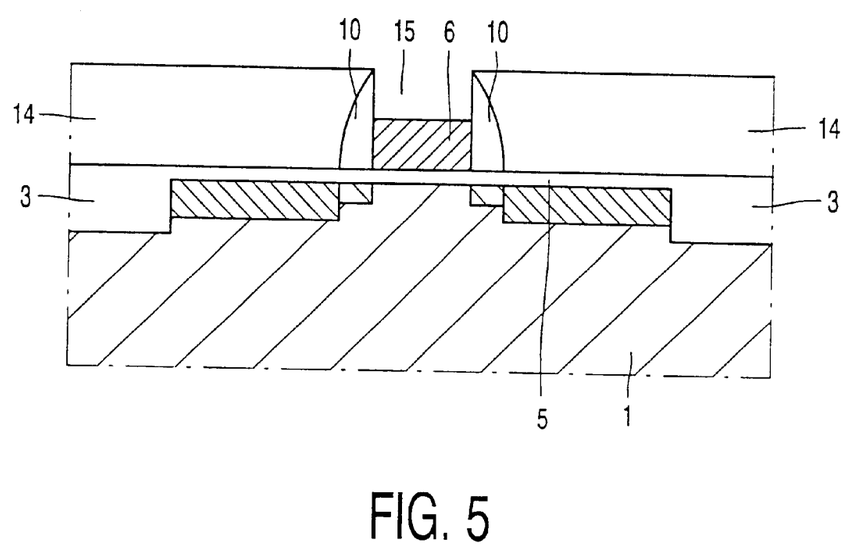

Subsequently, the dielectric layer 14 is removed over part of its thickness until the patterned layer 8 is exposed (FIG. 4). This can be accomplished by means of, for example, chemical-mechanical polishing (CMP) e.g. using a commercially available slurry. During the material removing treatment the second sub-layer 7, in the present example composed of silicon nitride, will act as a stop layer.

In a next step (FIG. 5), the second sub-layer 7, composed of silicon nitride in the present example, is removed selectively with respect to the dielectric layer 14 and the sidewall spacers 10, both composed of silicon oxide in the present example, by means of, for instance, wet etching using a mixture of hot phosphoric acid and sulphuric acid. In this way the dielectric layer 14 is provided with a recess 15.

Figure 6:
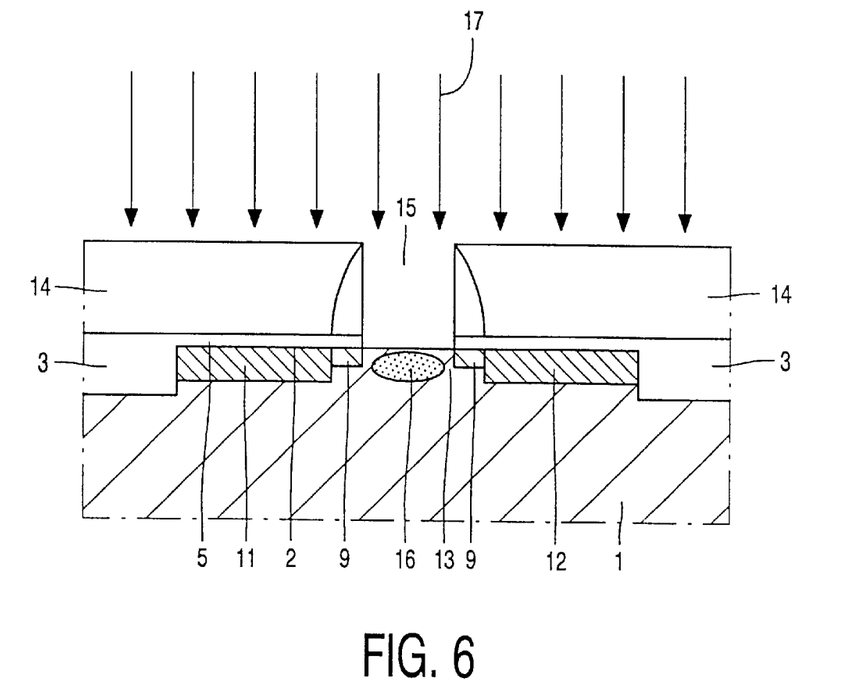

With reference to FIG. 6, the first sub-layer 6 and the layer 5 are removed in two separate etching steps. The first sub-layer 6, in the present example composed of polycrystalline silicon, can be removed selectively by means of wet etching using, for instance, a hot KOH solution or by means of plasma etching with, for instance, a $HBr/Cl_2$ mixture. The layer 5, in the present example composed of silicon oxide, can be removed by means of wet etching using HF. In a next step, the channel region 13 of the semiconductor body 1 is provided with an impurity region 16 of the first conductivity type, in the present example p-type, by introducing p-type impurities such as, for instance, boron (B), via the recess 15 into the channel region 13 in a self-registered way by using the dielectric layer 14 as a mask. The impurity region 16 can be applied as, for instance, a shallow region to correct the threshold voltage of the NMOS memory element and/or a deeper region to suppress punchthrough between the extended source zone 11,9 and the extended drain zone 12,9 of the NMOS memory element. Introduction of the p-type impurities into the semiconductor body 1 can be accomplished by means of diffusion from a chemical source provided at the surface 2 of the semiconductor body 1. However, for reasons given earlier, the p-type impurities are introduced preferably by means of ion implantation as depicted by arrows 17. In this respect, boron may be implanted at an energy lying in the range of about 20 to 60 keV, in a dose of about $2.10^{13}$ atoms/cm². It is understood by those skilled in the art that phosphorus (P) ions or arsenic (As) ions may be implanted in a non-volatile memory element of the PMOS-type for similar reasons. For instance, phosphorus may be implanted at an energy lying in the range of about 100 to 130 keV, in a dose of about $2.10^{13}$ atoms/cm², whereas arsenic may be implanted at an energy lying in the range of about 180 to 240 keV and in a dose of about $2.10^{13}$ atoms/cm². The implantation may be carried out substantially perpendicularly to the surface 2 of the semiconductor body 1. However, in order to counteract channeling of the impurities along crystal directions and planes, it is advantageous to perform the implantation at a small angle of a few, for instance seven, degrees with the normal to the surface 2 of the semiconductor body 1 by tilting the semiconductor body 1 before implantation. It is to be noted that the shallow region for threshold voltage correction and the deeper region for punchthrough suppression may be formed in two implantation steps carried out at different energies, or simultaneously in one implantation step at one energy level.

Figure 7:
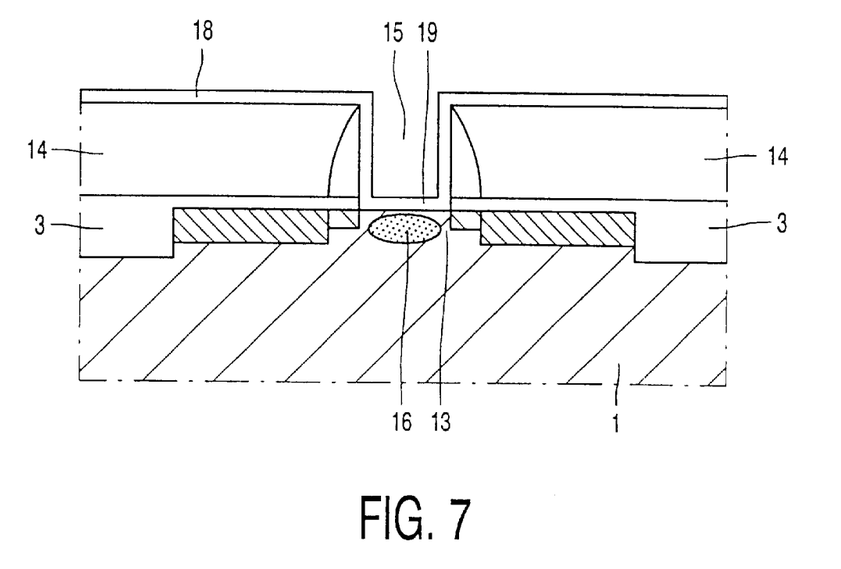

As shown in FIG. 7, a first insulating layer 18 is applied to all exposed surfaces, providing a floating gate dielectric 19. The first insulating layer 18 may be composed of silicon oxide, however, a dielectric material with a dielectric constant higher than that of silicon oxide, such as tantalum oxide, aluminum oxide or silicon nitride may be more favorable. If silicon oxide is to be applied for the floating gate dielectric 19, it may be obtained by means of, for instance, chemical vapor deposition or thermal oxidation of silicon. The high dielectric constant materials tantalum oxide, aluminum oxide and silicon nitride can be applied, for example, by means of chemical vapor deposition (CVD). The thickness of the first insulating layer 18 may be, for instance, in the range of about 10 to 20 nm.

It is to be noted that the above-mentioned ion implantation for punchthrough suppression and/or threshold voltage correction may be carried out after the application of the first insulating layer 18 as well. It is known that a thin layer composed of, for instance, silicon oxide, which is present at the surface of the semiconductor body, may improve the characteristics of ion implantation. However, if the first insulating layer 18 is composed of a dielectric material with a high dielectric constant, the high-temperature anneal associated with the ion implantation, with temperatures as high as about 900° C., may degrade the dielectric properties of the material applied.

Figure 8:
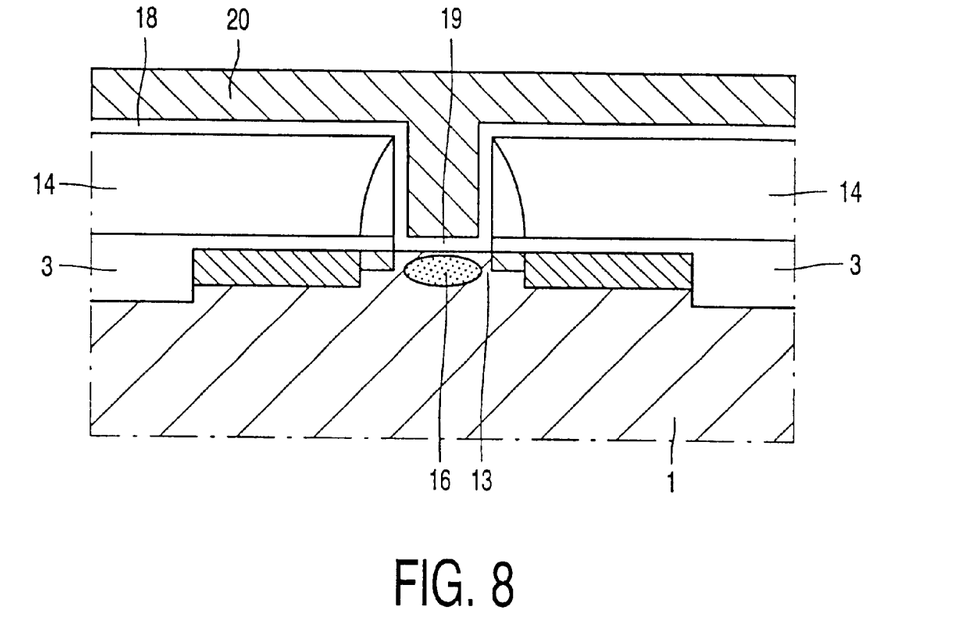

With reference to FIG. 8, a first conductive layer 20 is applied in a usual way, thereby filling the recess 15. Although polycrystalline silicon or possibly amorphous silicon or $Ge_xSi_{1-x}$ can be used, the first conductive layer 20 advantageously comprises a metal such as aluminum, tungsten, copper or molybdenum, or a combination of metals. It is to be noted, that the first conductive layer 20 may also be applied as a double-layer consisting of a layer comprising a metal such as aluminum, tungsten, copper or molybdenum, or a combination of metals on top of a layer acting as adhesion layer and/or barrier layer. In this respect Ti may be applied as adhesion layer and TiN or TiW as barrier layer.

Figure 9:
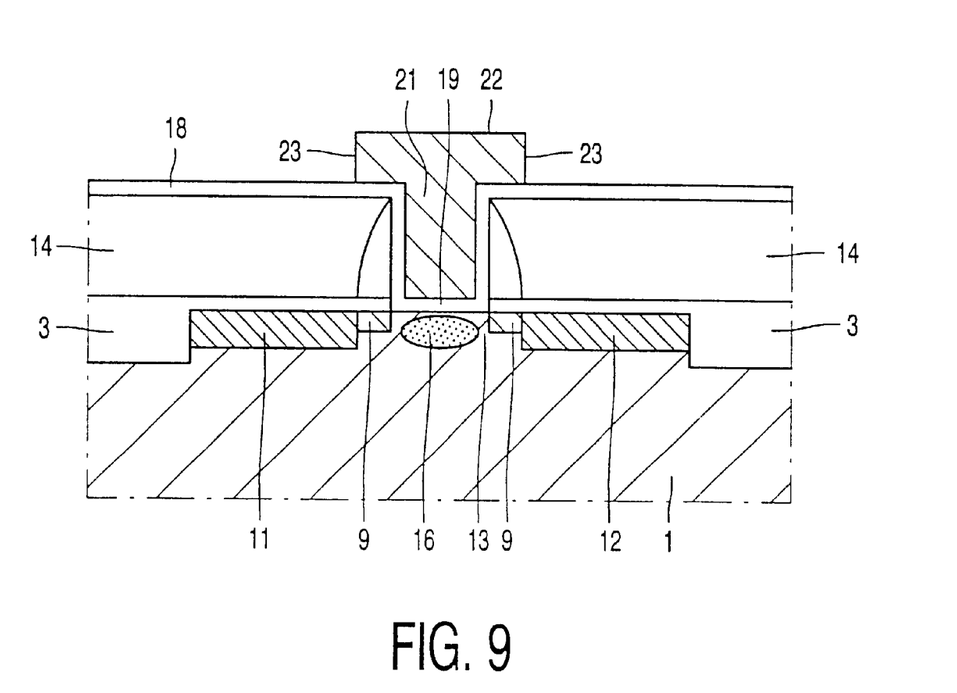

In a next step (FIG. 9), the first conductive layer 20 is shaped into a floating gate 21 by means of mask etching in a usual way, which floating gate 21 has a substantially flat surface portion 22 extending substantially parallel to the surface 2 of the semiconductor body 1 and sidewall portions 23 extending substantially perpendicularly to the surface 2 of the semiconductor body 1. In order to achieve a large capacitive coupling between the floating gate 21 and an overlapping control gate 27 to be provided at a later stage of the process (see FIG. 12), it is advantageous to use an oversized mask during etching of the first conductive layer 20. In that case the conductive material of the floating gate 21 stretches out over the dielectric layer 14, which is coated with the first insulating layer 18, to substantially beyond the recess 15, as shown in FIG. 7, at least in the directions of the source zone 11 and the drain zone 12, the result of which is shown in FIG. 9.

Figure 10:
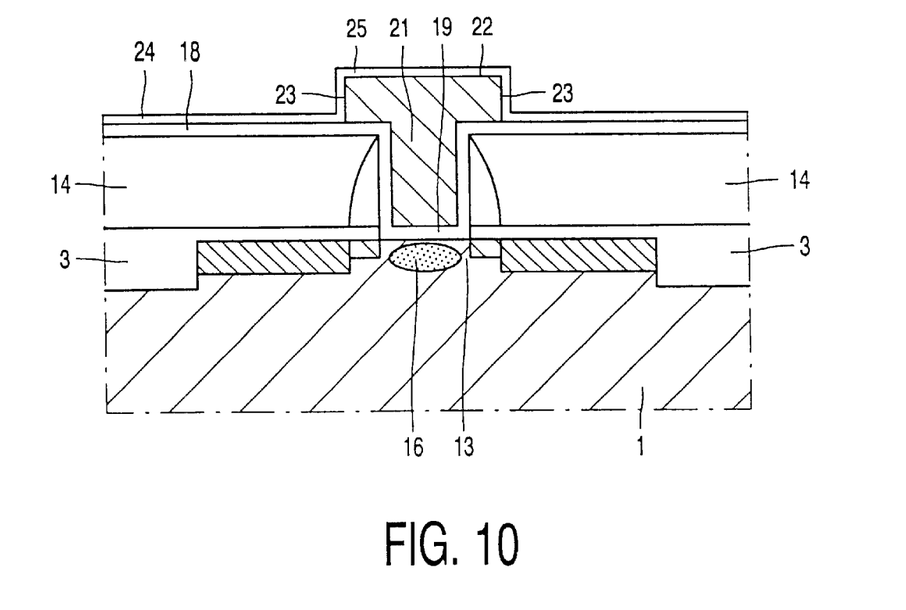

As shown in FIG. 10, a second insulating layer 24 is applied to all exposed surfaces, providing an inter-gate dielectric 25. The second insulating layer 24 may be composed of silicon oxide, silicon oxynitride (SiON), or a sandwich of silicon oxide and silicon nitride (ONO). However, a dielectric material with a dielectric constant higher than that of silicon oxide, such as tantalum oxide, aluminum oxide or silicon nitride may be more favorable. If silicon oxide is to be applied for the inter-gate dielectric 25, it may be obtained by means of, for instance, chemical vapor deposition or thermal oxidation of silicon. Silicon oxynitride (SiON), also referred to as $SiO_xN_y$ with x and y representing the fractions of oxygen and nitrogen, respectively, may be deposited as a single layer by means of, for instance, chemical vapor deposition (CVD). The sandwich of silicon oxide and silicon nitride (ONO) can be provided as a multilayer of a thermally grown silicon oxide, a deposited silicon nitride and a deposited or thermally grown silicon oxide. The high dielectric constant materials tantalum oxide, aluminum oxide and silicon nitride can be applied, for example, by means of chemical vapor deposition (CVD). The thickness of the second insulating layer 24 may be, for instance, in the range of about 10 to 20 nm.

Figure 11:
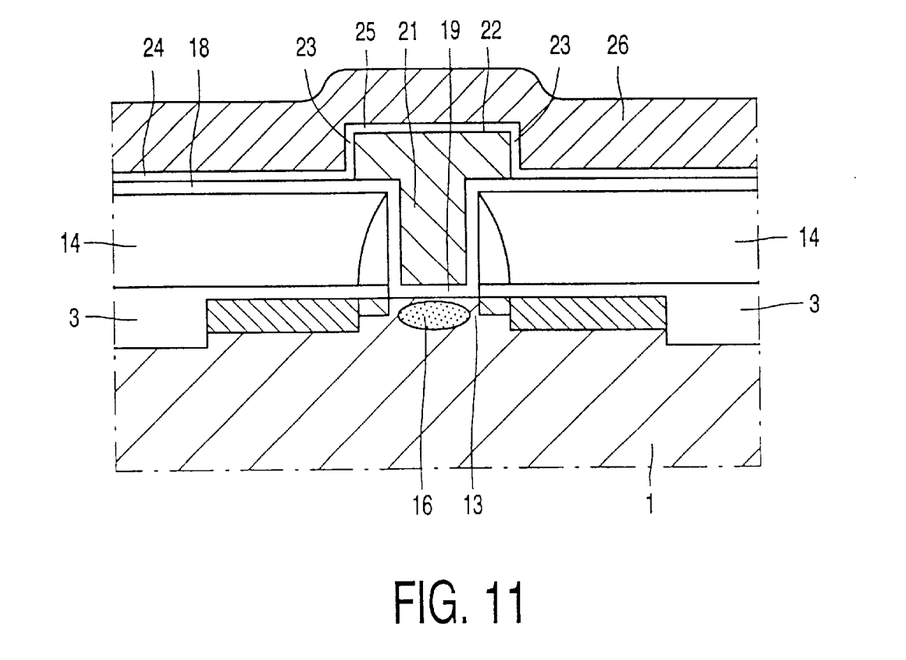

With reference to FIG. 11, a second conductive layer 26 is applied in a usual way, thereby covering the floating gate 21. Although polycrystalline silicon or possibly amorphous silicon or $Ge_xSi_{1-x}$ can be used, the second conductive layer 26 preferably comprises a metal such as aluminum, tungsten, copper or molybdenum, or a combination of metals. It is to be noted, that the second conductive layer 26 may also be applied as a double-layer consisting of a layer comprising a metal such as aluminum, tungsten, copper or molybdenum, or a combination of metals, on top of a layer acting as adhesion layer and/or barrier layer. In this respect Ti may be applied as adhesion layer and TiN or TiW as barrier layer.

Figure 12:
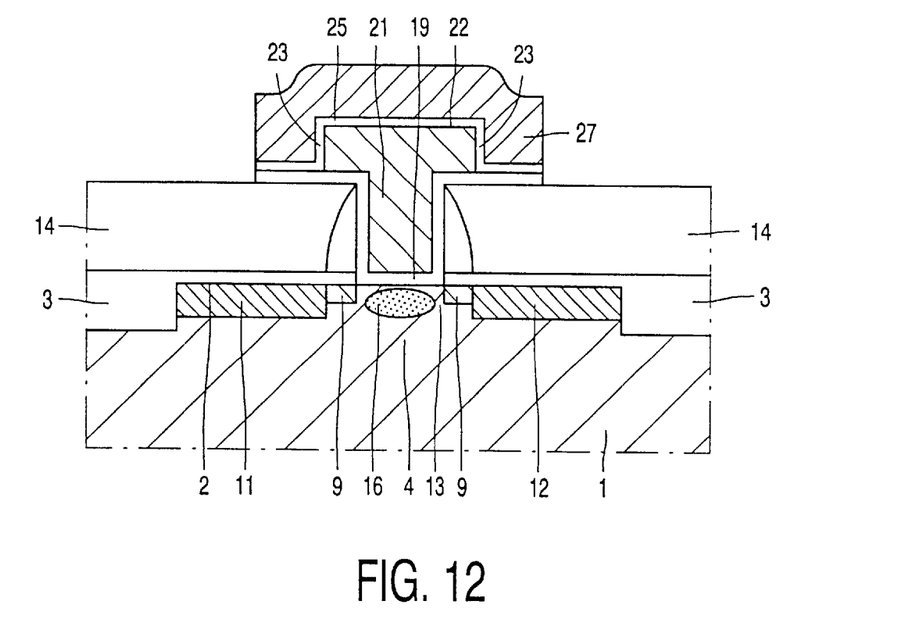

In a next step (FIG. 12), the second conductive layer 26 is shaped into an overlapping control gate 27 by means of masked etching in a usual way. The overlapping control gate 27 is capacitively coupled not only to the substantially flat surface portion 22 of the floating gate 21 but also to at least the sidewall portions 23 of the floating gate 21 situated adjacent to the source zone 11 and the drain zone 12. An additional removal of the second insulating layer 24 and the first insulating layer 18 using the same mask, the result of which is shown in FIG. 12, is not required, but can be beneficial in case a material with a high dielectric constant is applied for the second insulating layer 22 and/or the first insulating layer 18.

Finally, the semiconductor device may be completed by conventional CMOS process flow steps (not shown) for oxide deposition, contact definition and metallization with one or more metal layers.

Figure 13:
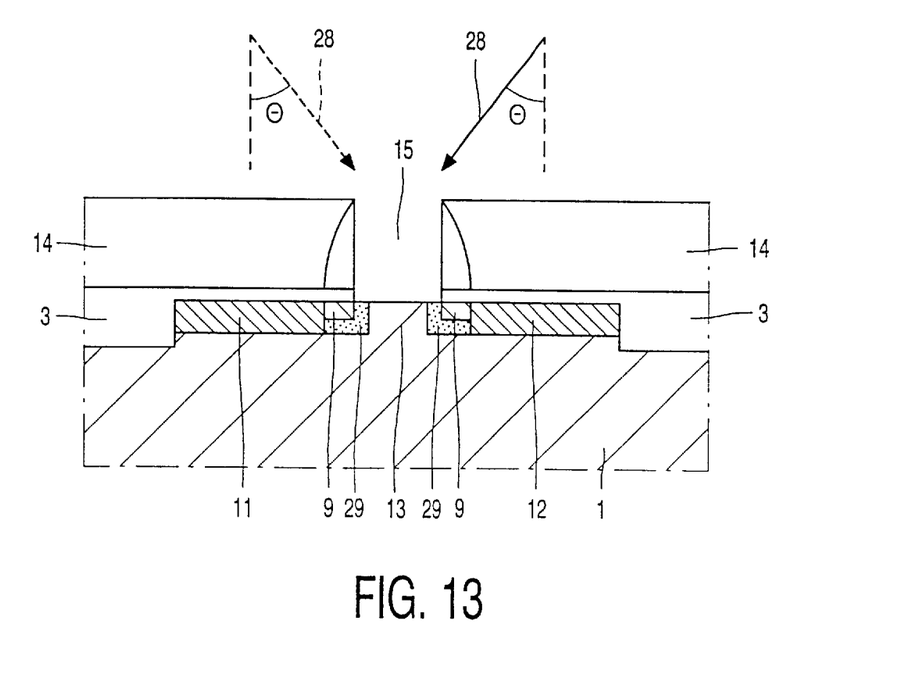
FIGS. 13 and 14 show in diagrammatic cross-sectional views two stages in the manufacture of a semiconductor device comprising a non-volatile memory element, using a second embodiment of the method in accordance with the invention.
Figure 14:
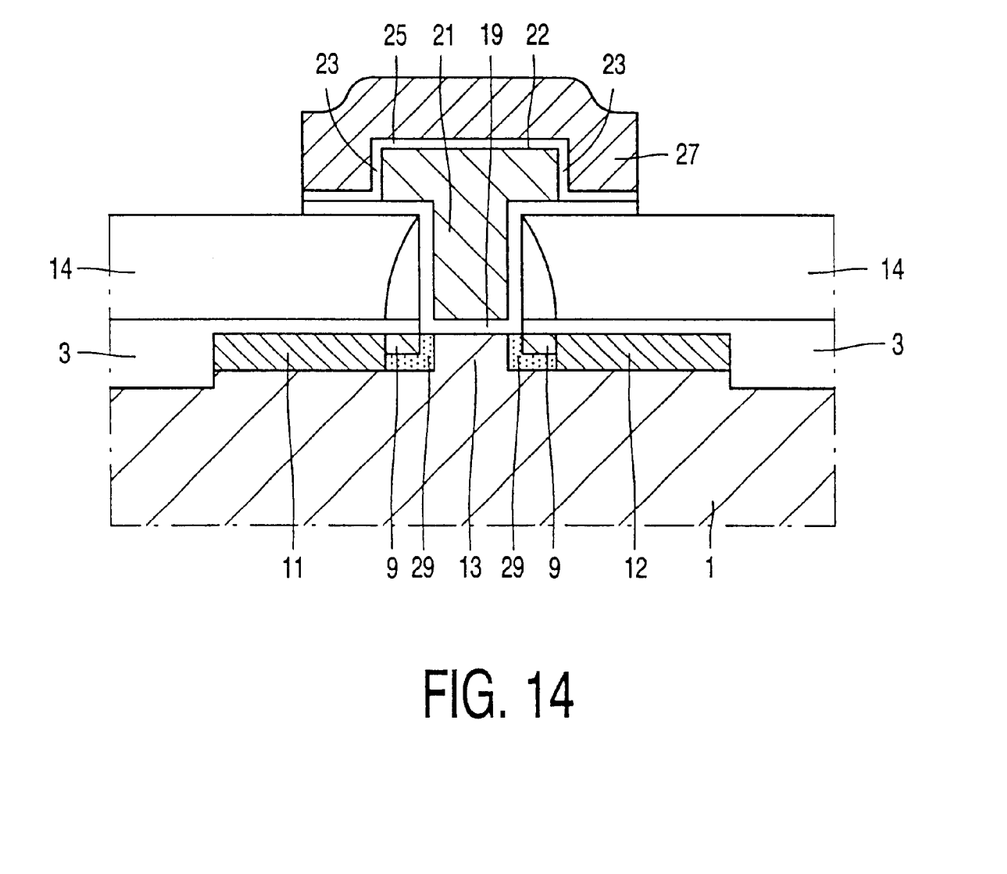

FIGS. 13 and 14 show in diagrammatic cross-sectional views two stages in the manufacture of a semiconductor device comprising a non-volatile memory element, using a second embodiment of the method in accordance with the invention.

FIG. 13 shows the same situation as FIG. 6 except for the ion implantation, as depicted by arrows 28, which takes place at an acute angle θ with the normal to the surface 2 of the semiconductor body 1. The channel region 13 of the semiconductor body 1 is provided with impurity regions 29 of the first conductivity type, in the present example p-type, by implanting p-type impurities such as, for instance, boron (B) ions, at an angle θ lying in the range of about 15 to 75° via the recess 15 into the channel region 13 by using the dielectric layer 14 as a mask. Obviously, the maximum angle θ at which the impurities can be implanted into the channel region 13 is dependent on the aspect ratio of the recess 15 in the dielectric layer 14. The ion implantation is carried out in two steps, with the semiconductor body 1 rotated through 180° between the two steps. Naturally, circuit layouts with gates oriented at right angles to other gates require four implantations 90° apart. The impurity regions 29 can be applied by means of, for instance, a so-called halo implant, also known as pocket implant, which results in a more efficient hot-carrier generation and, hence, increases the program speed of the memory element. In this respect, boron may be implanted at an energy lying in the range of about 10 to 60 keV, in a dose of about $6.10^{12}$ to $4.10^{13}$ atoms/cm$^2$. It is understood by those skilled in the art that phosphorus (P) ions or arsenic (As) ions may be implanted in a non-volatile memory element of the PMOS-type for similar reasons. For instance, phosphorus may be implanted at an energy lying in the range of about 60 to 90 keV, in a dose of about $6.10^{12}$ to $4.10^{13}$ atoms/cm$^2$, whereas arsenic may be implanted at an energy lying in the range of about 80 to 140 keV, in a dose of $6.10^{12}$ to $4.10^{13}$ atoms/cm$^2$. It is to be noted, that just the extended drain zone 12,9 or the extended source zone 11,9 may be provided with an impurity region like those indicated by reference numeral 29 as well.

After the implantation of the impurity regions 29, similar steps as described with reference to FIGS. 7 to 12 are performed, the result of which is shown in FIG. 14.

Finally, the semiconductor device may be completed by conventional CMOS process flow steps (not shown) for oxide deposition, contact definition and metallization with one or more metal layers.

It will be apparent that the invention is not limited to the embodiments described above, but that many variations are possible to those skilled in the art within the scope of the invention. For instance, the source zone and the drain zone of the non-volatile memory element can optionally be implanted without extensions. Evidently, the method of the invention can also be used to provide the channel region of the non-volatile memory element with mutually divergent impurity regions by carrying out a plurality of implantations involving different types of impurities and different angles θ with the normal to the surface of the semiconductor body. Furthermore, in order to reduce the parasitic resistance of the source zone and the drain zone, the source zone and the drain zone may be subjected to a salicide process using Ti or Co, thereby forming self-aligned silicides of Ti ($TiSi_2$) or Co ($CoSi_2$), respectively, on the source zone and the drain zone. In the embodiments described above, the active region is provided by a surface region of the original semiconductor body. Alternatively, the active region may represent a conventional p or n well, which is obtained by means of locally doping the original semiconductor body in a region adjoining its surface with a doping concentration suitable for providing an n-channel or p-channel non-volatile memory element.

What is claimed is:

1. A method of manufacturing a semiconductor device comprising a semiconductor body which is provided at a surface with a non-volatile memory element having a floating gate situated between an overlapping control gate and a channel region which is situated in the semiconductor body and extends between a source zone and a drain zone, by which method an active region of a first conductivity type adjoining the surface is defined in the semiconductor body, and a floating gate dielectric is provided, to which floating gate dielectric the floating gate is applied, the floating gate having a substantially flat surface portion extending substantially parallel to the surface of the semiconductor body and having sidewall portions extending substantially perpendicularly to the surface of the semiconductor body, which floating gate is provided with an inter-gate dielectric, to which inter-gate dielectric the control gate is applied, which control gate is capacitively coupled with the substantially flat surface portion of the floating gate and with at least the sidewall portions of the floating gate situated adjacent to the source zone and the drain zone, comprising, after defining the active region, applying a patterned layer, which patterned layer acts as a mask during the formation of the source zone and the drain zone of a second conductivity type in the semiconductor body, then providing a dielectric layer in a thickness which is sufficiently large to cover the patterned layer, removing the dielectric layer over part of its thickness by means of a material removing treatment until the patterned layer is exposed, removing the patterned layer, thereby forming a recess in the dielectric layer, applying a first insulating layer in the recess, thereby providing the floating gate dielectric of the memory element, applying a first conductive layer to the first insulating layer, thereby filling the recess in the dielectric layer, shaping first conductive layer into the floating gate by means of masked etching, covering the floating gate by a second insulating layer, thereby providing the inter-gate dielectric of the memory element, and applying a second conductive layer to the second insulating layer, and shaping the second conductive layer into the overlapping control gate.

2. A method as claimed in claim 1, characterized in that the floating gate is formed from the first conductive layer so as to stretch out over the dielectric layer to substantially beyond the recess at least in the directions of the source zone and the drain zone.

3. A method as claimed in claim 1, characterized in that prior to applying the first conductive layer providing the floating gate, impurities are introduced via the recess into the channel region of the semiconductor body in a self-registered way by using the dielectric layer as a mask.

4. A method as claimed in claim 3, characterized in that the impurities are introduced into the channel region of the semiconductor body by means of ion implantation.

5. A method as claimed in claim 4, characterized in that the impurities are implanted into the channel region at an acute angle with the normal to the surface of the semiconductor body.

6. A method as claimed in claim 3, characterized in that the channel region is provided with an impurity region for reaching an effect selected from punchthrough suppression, threshold voltage correction, and punchthrough suppression and threshold voltage correction.

7. A method as claimed in claim 1, characterized in that the patterned layer is applied by depositing and patterning a layer comprising silicon.

8. A method as claimed in claim 7, characterized in that the layer comprising silicon is applied as a double-layer including a first sub-layer comprising the silicon and, on top thereof, a second sub-layer composed of a material having a larger resistance towards the material removing treatment than silicon and being selectively etchable with respect to the dielectric layer.

9. A method as claimed in claim 8, characterized in that silicon oxide is applied as the dielectric layer, and the second sub-layer is applied by depositing a layer comprising silicon nitride.

10. A method as claimed in claim 1, characterized in that the first conductive layer providing the floating gate is applied by depositing a layer comprising a metal.

11. A method as claimed in claim 1, characterized in that the second conductive layer providing the control gate is applied by depositing a layer comprising a metal.

12. A method as claimed in claim 10, characterized in that one element of the group comprising aluminum, tungsten, copper and molybdenum is applied as the metal.

* * * * *